US005756400A

United States Patent [19]

Ye et al.

[11] Patent Number: 5,756,400

[45] Date of Patent: May 26, 1998

[54] METHOD AND APPARATUS FOR CLEANING BY-PRODUCTS FROM PLASMA CHAMBER SURFACES

[75] Inventors: Yan Ye, Campbell; Diana Xiaobing Ma, Saratoga; Gerald Zheyao Yin, Sunnyvale; Keshav Prasad, San Jose; Mark Siegel, Santa Clara; Steve S. Y. Mak, Pleasanton; Paul Martinez, Milpitas; James S. Papanu, San Rafael; Danny Chien Lu, Milpitas, all of Calif.

[73] Assignee: Applied Materials, Inc., Santa Clara, Calif.

[21] Appl. No.: 568,064

[22] Filed: Dec. 8, 1995

[51] Int. Cl.[6] .............................. C23F 4/00; H01L 21/00

[52] U.S. Cl. ........................... 438/710; 438/905; 134/1.1

[58] Field of Search .................................... 134/1.1, 22.1, 134/22.11; 216/67, 68; 156/643.1, 646.1, 345; 438/710, 905

[56] References Cited

U.S. PATENT DOCUMENTS 3,806,365 4/1974 Adir Jacob .................................. 134/1
4,975,146 12/1990 Knapp et al. ............................ 134/1.1
5,221,423 6/1993 Sugino et al. ........................ 156/643.1
5,281,302 1/1994 Gabric et al. ............................. 216/67
5,356,478 10/1994 Chen et al. ........................ 134/22.1 X
5,380,370 1/1995 Niino et al. .......................... 134/22.11
5,415,728 5/1995 Hasegawa et al. .................. 156/643.1
5,567,268 10/1996 Kadomura ....................... 156/643.1 X

*Primary Examiner*—Thi Dang
*Attorney, Agent, or Firm*—Robert W. Mulcahy

[57] ABSTRACT

The present invention provides an apparatus and process for plasma cleaning the interior surfaces of semiconductor processing chambers. The method is directed to the dry etching of accumulated contaminant residues attached to the inner surfaces of the plasma processing chamber and includes introducing a cleaning gas mixture of a halogen-containing gas; activating a plasma in an environment substantially free of oxygen species; contacting the contaminant residues with the activated cleaning gas to volatilize the residues; and removing the gaseous by-products from the chamber. The etchant gaseous mixture comprises an even or greater amount of at least one fluorine-containing gas and an even or lesser amount of at least one chlorine-containing gas. The instant invention enables the intermittent use of the cleaning steps in an ongoing plasma processing of semiconductor wafers without chamber downtime and significant loss of wafer production.

13 Claims, 2 Drawing Sheets

METHOD AND APPARATUS FOR CLEANING BY-PRODUCTS FROM PLASMA CHAMBER SURFACES

FIELD OF THE INVENTION

The present invention is related to a method and apparatus for removing previously deposited parasitic contaminant residues which have accumulated on the interior surfaces of a vacuum treatment chamber. More particularly, the invention is directed to a plasma apparatus and a dry-clean etch process employing certain halogenated cleaning gases to remove semiconductor residue build-up on the inner parts and surfaces of plasma processing chambers.

DESCRIPTION OF THE BACKGROUND ART

As the geometries of semiconductor devices become ever so smaller, the ability to maintain the uniformity and accuracy of critical dimensions becomes strained. Many of the processes carried out within semiconductor processing reactors leave contaminant deposits on the walls of the process chamber which accumulate and become the source of particulate matter harmful to the creation of a semiconductor device. As the dimension size of semiconductor substrate features has become ever smaller, the absence of contaminant particulate matter upon the surface of the semiconductor workpiece has become an ever more critical goal.

Particulate contaminant deposit buildup on semiconductor process chamber walls can be particularly significant when metal etching processes are carried out in the chamber. In particular, the etching of an aluminum pattern produces relatively large accumulations of such contaminant buildup. These aluminum films are generally etched by employing a number of reactive gases, including halogen and halocarbon gases, as plasma components. More specifically, the enchant gases used are predominantly the chlorine-containing gases, chlorine ($Cl_2$) and boron trichloride ($BCL_3$), which enables formation of volatile aluminum chloride compounds upon etching, which volatile compounds can be removed from the etch processing chamber by applied vacuum.

However, simultaneously with the formation of volatile aluminum chloride compounds, other active chlorine- and boron-containing species are formed which can react with any oxygen and water vapor present in the etch processing chamber or with organic species from patterned photoresist to form nonvolatile compositions which produce contaminant deposition on the inner wall surfaces and other interior surfaces of the process chamber. As time progresses, the thickness of this contaminant build-up increases, and the attached deposits can easily flake and break free of the surface to which they are attached and fall upon a workpiece surface, causing contamination and resulting in a defective wafer workpiece. To avoid processing of potentially defective wafers under these conditions, the chamber must be shut down and a major cleaning performed.

Known plasma chamber cleaning methods have involved opening the plasma etch chamber, disassembling portions of the chamber, and removing the contaminant deposits by physical or chemical methods. For example, the chamber can be rinsed with a solution of water and isopropyl alcohol, or hand wiped with a solvent, to dissolve various contaminants. The etch chamber alternatively may be washed with water, wiped with alcohol and dried. All of these "wet" cleaning methods are complicated, disruptive, time consuming, and can be the source of additional contamination. Moreover, because a major cleaning process can take up to 24 hours of lost production time for large plasma reactors, these cleaning interruptions are inordinately expensive.

Plasma-enhanced dry-cleaning processes exist whereby contaminants attached to the inside walls of a metal etch reaction chamber are removed by plasma etching using carbon tetrachloride and oxygen. However, presently known plasma-enhanced dry cleaning systems require a dry cleaning time period equal to about 5% to 10% of the time spent in the metal etching process itself. Moreover, while present prior art chamber dry cleaning processes employ plasma etch halogenated gases, such as $Cl_2$, $CCl_4$, HCl, $CF_4$, and $C_2F_6$, they generally employ an oxidizing agent, such as $O_2$ or $H_2O_2$, which oxygenated compounds have certain disadvantages. For example, metal etch dry-cleaning recipes which include halogenated compounds and oxygen or oxygen-containing gases have been found unsatisfactory because of formation of powdery aluminum oxyhalide by-products which are equally workpiece contaminating to those originally targeted for removal.

U.S. Pat. No. 5,356,477 to Chen et al., issued Oct. 18, 1994, discloses a single-step plasma cleaning method in which a mixture of a chlorine-containing gas and an oxygen-containing oxidizing agent is introduced into a plasma processing chamber and a plasma activated whereby the cleaning-gas plasma removes organic and metallic-containing residues on the interior surfaces of the chamber. The patent teaches the optional addition of fluorinated gases, such as $CF_4$, as part of the cleaning gas mixture. While this cleaning-gas recipe and process is effective in removing residues from the plasma chamber's interior surfaces, the use of an oxygen-containing gas is a necessary part of the patented dry-clean recipe and is inherently problematic because of the formation of undesirable aluminum oxyfluoride, a solid powdery contaminant by-product of this cleaning technique.

U.S. Pat. 4,786,359 to Gabric et al., issued Jan. 25, 1994, describes a plasma-cleaning process and apparatus in which a fluorocarbon etching gas recipe, such as $C_2F_6$ or $CF_4$ and an ozone/oxygen mixture, is plasma activated in a vacuum chamber at an excitation frequency in the R.F. range and chamber cleaning is carried out efficiently and at a high etch rate. The patent teaches that the use of halocarbon etchant gases results in polymer film deposition in the plasma reactor and cites such formation as a negative factor in the use of such gases. The addition of the oxygen/ozone mixture reduces such polymer formation and, consequently, is an indispensable ingredient of the etchant gas mixture of the patent. Again, as in the prior art dry-clean recipes cited above, this etchant gas mixture will generate solid parasitic fluoroaluminum by-products, i.e., aluminum oxyfluoride.

All of the cited dry-clean prior art describes the plasma activation of a cleaning etchant gas mixture which includes halogen and/or halocarbon gases and oxidizing agents. While these cleaning gas recipes and processes efficiently remove the interior contaminant residues in the chamber, the techniques are inherently limited because of the use of oxygen-containing gases which produce nonvolatile aluminum oxyhalides by-products which are workpiece contaminants in wafer plasma processing systems. Moreover, an aluminum oxyhalide, such as aluminum oxyfluoride, is in the form of a solid powder and it can plug small orifices in the process chamber, such as the pores of a gas distribution plate. Therefore, any use of an oxygenated species in a halogen gas dry-clean etch generates an equally undesirable wafer contaminant and process-debilitating product, a powdery aluminum oxyhalide.

The contaminating deposits on plasma process chamber walls can be removed in a plasma either by ion bombardment or by chemical reaction. Since the plasma chamber wall is normally electrically grounded, the ion bombardment (sputtering effect) upon the chamber wall itself is generally not very effective, and chemical reaction is preferred for cleaning process chamber surfaces. The most preferred way to remove the contaminant deposits using a chemical reaction is to convert the deposits to a volatile species which can be vacuum pumped from the plasma process chamber. Thus, it would be desirable to provide a method of dry cleaning plasma process chambers (particularly metal etch chambers) which converts contaminant deposits on the surfaces of the process chamber to volatile species which can be easily removed from the process chamber and not generate additional undesirable by-products.

It would be further desirable to have an efficient plasma chamber dry cleaning method which could operate as an independent step or as part of the ongoing wafer etch process. Such an intermittent cleaning technique would not seriously interrupt wafer throughput processing and would prevent the accumulation of flaking contaminant etch by-products on the interior surface of the plasma chamber. The overall advantages of such an in-situ cleaning technique are an improved quality control of processed wafers (fewer contaminated or defective processed workpieces) and a reduction in mandatory shutdowns of the plasma chamber for general wet cleaning. Such shutdowns in large chambers result in a costly inoperable period for the vacuum chamber of up to 24 hours and, consequently, in lost production of processed workpieces.

The present invention is based on the discovery of a precise dry-clean chemistry recipe used in a plasma environment free of any atomic oxygen for the removal of previously deposited parasitic residues on the interior surfaces and elements of vacuum plasma processing chambers. A gas mixture of chlorine and fluorine containing inorganic gases has been found effective in the plasma dry-cleaning of the interior elements and surfaces of plasma treatment chambers. While the cleaning mechanisms are not well understood, the present inorganic gas recipes include a fluorine-containing gas, such as $NF_3$, which presumably reacts with organic residues under plasma conditions to remove the carbon material. One possible overall reaction is given by the following equation:

$$4NF_3+3C\rightarrow 3CF_4+2N_2.$$

The chlorine-containing gas presumably reacts with metallic contaminant residues to form gaseous metallic chlorides; $AlCl_x$, most likely $AlCl_3$.

SUMMARY OF THE INVENTION

The present invention provides a method for cleaning and controlling the buildup of contaminant plasma process by-products accumulated on the interior surfaces of semiconductor processing chambers, thereby significantly reducing the amount of apparatus downtime required for major cleaning of the chamber. The present invention extends the time periods between mandatory process chamber wet cleaning by providing a single plasma activation dry cleaning step employing a certain mixture of chlorine and fluorine-containing gases in the absence of oxygen or atomic oxygen-containing species. The single cleaning step comprises: (a) introducing a halogen-containing plasma reactant gas mixture comprised of an equal or greater amount of fluorine-containing gas and an equal or lesser amount of a chlorine-containing gas into a vacuum plasma processing chamber which is substantially free of atomic oxygen-containing species; (b) generating a plasma of said reactant gas; and (c) contacting said plasma and/or generated species on accumulated residues attached to the interior surfaces of the chamber whereby the plasma gases selectively react with and volatilize the organic and metallic residues into gaseous species which are removed from the chamber through the exit port of the chamber.

The distinguishing feature of the present invention is that certain mixtures of halogen-containing plasma reactive gases can be plasma activated in the absence of oxygen and the resulting plasma brought into contact with the interior surfaces of the chamber to efficiently and effectively volatilize surface-attached residues and remove them from the chamber. The present cleaning technique can be used as an independent operable process or as a subprocess of an ongoing plasma processing of semiconductors. In this way the shutdown intervals needed for major wet cleaning of the chamber are less frequently required, thereby improving the overall cost efficiency of the plasma processing of semiconductors. Preferred gases herein are mixtures of inorganic halogen-containing gases.

When the plasma etching of aluminum is carried out in the plasma processing chamber, at least a portion of the non-volatile contaminant deposits found on the chamber walls are polymeric forms of $Al_xCl_y$, wherein x and y are numbers ranging from about 1 to about 5. Generally, these nonvolatile contaminant deposits are formed due to the presence of various elements such as, for example, carbon, boron, nitrogen and hydrogen, within the etch chamber during the plasma etching. The plasma dry cleaning of a reactor chamber using the present inorganic halogen gas mixture in an environment substantially free of oxygen enables the targeting of each of these contaminant groups for volatilization and expeditious removal from the chamber. In addition, the dry-clean recipes of the instant invention do not form other undesirable solid contaminant by-products, such as metallic oxyhalides, as would have been generally expected in the etch dry cleaning of chambers laden with accumulated $Al_xCl_y$ contaminants.

Prior to the present invention, the use of inorganic fluorinated gases, such as $NF_3$, $SF_6$, or $F_2$, and fluorocarbon gases, such as $CF_4$ and $C_4F_8$, in combination with oxygen, $O_2$, was commonly known and effective in dry-etch cleaning for removing accumulated organic residues. However, these plasma reactive gases generated the contaminant by-product, aluminum oxyfluoride ($Al_xO_yF_z$). The formation of aluminum oxyfluoride was generally considered unavoidable because of the virtual omnipresence of oxygen in the cleaning recipes. The instant etch dry-clean gas recipe overcomes the expectancy of undesirable by-product formation by using a mixture of an equal or greater volumetric amount of plasma reactive inorganic fluoride gas and an equal or lesser volumetric amount of an inorganic chloride gas in a plasma environment substantially free of oxygen species.

The present invention provides a plasma processing apparatus and a method for dry cleaning the interior surfaces thereof using the instant halogen etchant gas mixture recipe in a substantially atomic oxygen free plasma environment. Additionally provided herein is a method for plasma etching a semiconductor workpiece, including employing the instant etch dry-clean technique as a subprocess. The effectiveness and efficiency of the instant inorganic halogen gas mixture enables its use as an intermittent or in-situ step in an ongoing plasma etch process. The advantages to such an application include continual contaminant residue removal from the interior surfaces of the chamber without frequent chamber shutdown for major wet cleaning, thereby interrupting wafer throughput production. Moreover, the instant cleaning technique can be employed with random nondisruptive frequency so as to prevent the accumulation of flaking residues which would inevitably result in floating particulate contaminants in the plasma etch process.

A method of the present invention comprises the steps of:

a) introducing a plasma reactive halogen gas mixture of an equal or greater volumetric amount of a fluorine-containing gas and a lesser or equal volumetric amount of an chlorine-containing gas into a plasma processing chamber;

b) activating the plasma reactive gas mixture and forming a plasma in an environment substantially free of atomic oxygen-containing species; and c) contacting the interior surfaces of the chamber with the volatile reactive species of the plasma whereby at least a portion of accumulated solid plasma processing residues are volatilized and removed from the chamber.

The instant invention is further directed to a method of residue-controlled plasma processing of a workpiece comprising:

a) providing a plasma processing apparatus comprised of a chamber and a pair of electrodes disposed opposite to one another;

b) supplying electrical energy in the chamber sufficient to generate plasma discharge conditions, one of which electrodes supports a semiconductor workpiece;

c) communicating into the chamber a reactive gas capable of forming a plasma under the electrical energy applied to the electrodes;

d) plasma processing the workpiece wherein solid residues are generated and attach to the interior walls of the chamber as contaminant deposits;

e) removing the workpiece from the chamber; and f) conducting a dry-cleaning step comprised of: 1) introducing a plasma reactive halogen gas mixture of an equal or greater volumetric amount of fluorine-containing gas and an equal or lesser volumetric amount of an inorganic chlorine-containing gas into the internal space of the chamber which is substantially free of atomic oxygen chemical species; 2) generating a plasma of the reactant halogen gas mixture; and 3) contacting the accumulated contaminant deposits attached to the interior surfaces of the chamber with the plasma (and/or reactive species) whereby the plasma volatilizes the residues into gaseous species which are removed from the chamber.

The instant invention is still further directed to an improvement in a plasma apparatus for processing workpieces comprising a metallic chamber, a source of plasma-generating material and means for admitting such material into said etch chamber, and an electromagnetic energy source electrically coupled to an electrode in said chamber to generate a plasma therein, the improvement comprising a means for adjusting the admission of plasma-generating gas comprised of a mixture of an equal or greater volumetric amount of a fluorine-containing gas and an equal or lesser amount of a chlorine-containing gas into a plasma environment substantially free of any oxygen species.

DETAILED DESCRIPTION OF THE INVENTION

Figure 1:
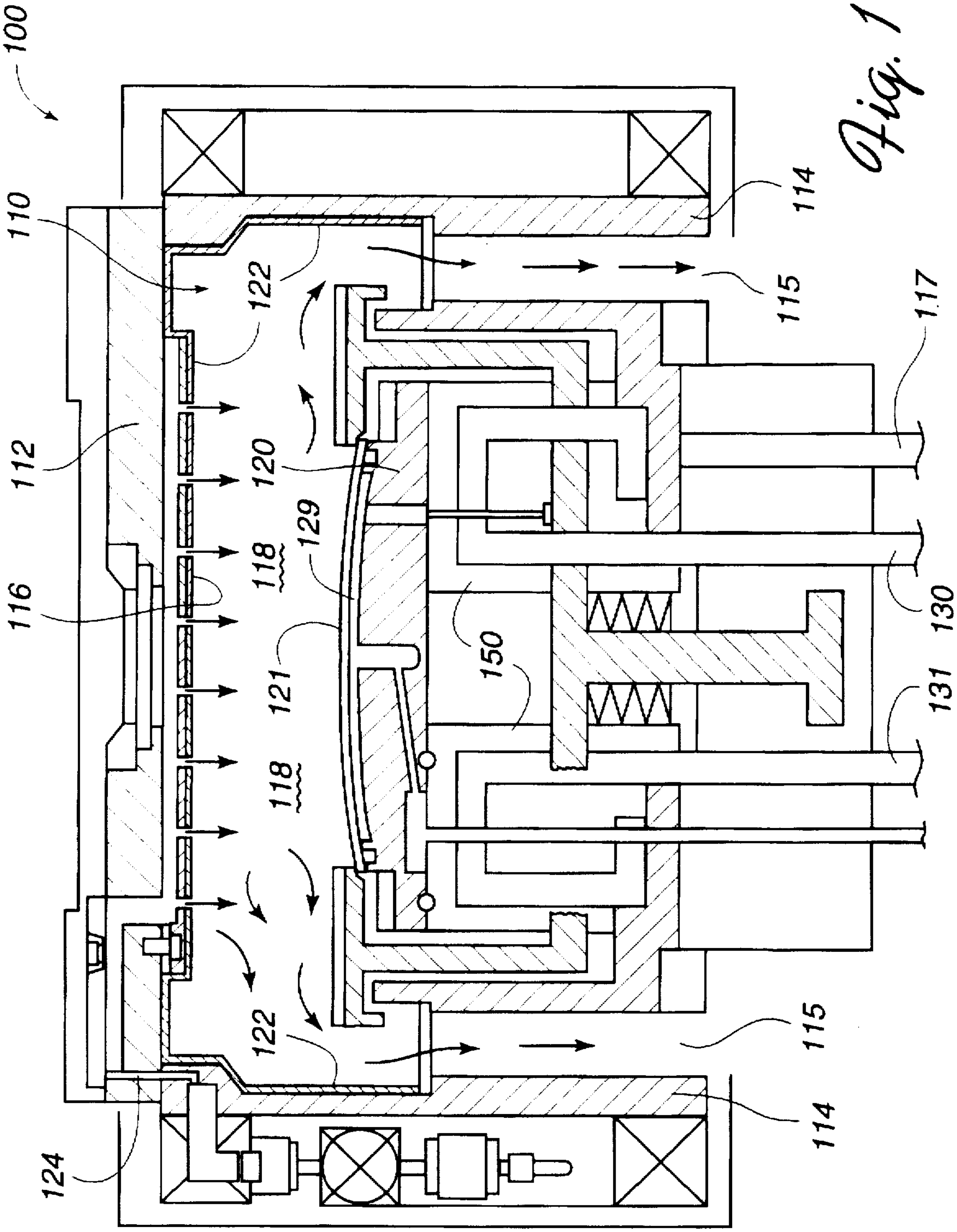
FIG. 1 is a schematic of a vertical cross section of a capacitively coupled plasma etching device demonstrating the cleaning effect of the inorganic halogen gas mixture of the present invention.

In the plasma processing methods of the present invention, a certain mixture of halogen etch gases are used as a recipe for dry cleaning the interior surfaces of a plasma processing device. The dry-clean application of the present gaseous mixture is carried out in a plasma environment substantially free of any oxygen species. One of the mixture gases is a fluorine-containing gas, such as $SF_6$, $NF_3$, $ClF_3$, $CF_4$, $CHF_3$, and $C_4F_8$. The other gas is an inorganic chlorine-containing gas such as $Cl_2$, HCl, $BCl_3$, $CCl_4$, and $SiCl_4$. The instant halogenated cleaning gas mixture is provided to the chamber in separate gas flow rates to effect a preferable mixture containing an even or greater volumetric amount of the fluorine-containing gas and an even or lesser volumetric amount of the chlorine-containing gas. Preferably, the halogen gas mixture contains a majority of fluorine-containing gas by volume and, more preferably, in an amount in excess of 50% (but not to exceed 90%) by volume of the gaseous mixture. It is the combined effect of this reactive gas mixture operating in a plasma environment which is substantially free of any oxygen species that enables effective dry cleaning of the interior surfaces of a plasma processing chamber.

The present invention is further directed to a method and apparatus for the removal of contaminant particles from the interior surfaces of a plasma reactor chamber by plasma dry cleaning with the instant halogen gas mixture. The invention is particularly useful in removing parasitic contaminant deposits generated in the plasma etch of metallic workpieces. The process is described in the following preferred embodiments in terms of the volatilization of organometallic deposits and particularly organometallic materials comprising aluminum and compounds thereof generated in metal etch processes. However, the concept of employing the instant inorganic halogenated gas mixture in a plasma etch system for purposes of volatilizing plasma generated by-products and removing them from the plasma chamber wall is applicable to semiconductor process chambers in general.

The amount of fluorine-containing gas, such as $SF_6$, used in the dry-clean of the etch chamber should range from about 50 to about 90 volume percent of the total amount of the present halogenated etchant gas mixture used. Correspondingly, the amount of chlorine-containing gas should be from about 10 to 50 volume percent. Preferably, the amount of fluorine-containing gas should be in a range of about 52% to 88% by volume. Thus, for example, when the instant etchant gas mixture is flowed into a 9 liter etch chamber at a flow rate of from about 20 standard cubic centimeters per minute (sccm) to about 60 sccm, the flow rate of the fluorine-containing gas will range from about 10 sccm (50 volume % of 20 sccm) to about 54 sccm (90 volume % of 60 sccm). When a larger or smaller etch chamber is used, the flow rates may need to be adjusted, respectively, either upwardly or downwardly, but the ratio of the fluorine-containing gas to the total of the dry etchant gas mixture used in the process will remain the same.

The total amount of etchant gas that is flowed into the etching chamber for the instant dry-clean etching process will vary somewhat depending upon the size of the chamber and the size of the wafer. Typically, for an etching chamber of about 13 liters, such as that utilized in the Applied Materials Precision 5000 MERIE Etch System, a capacitively coupled plasma etch system, the total gas flow may suitably be between about 20 sccm and about 500 sccm, and preferably remains below about 200 sccm. For other etching chambers, such as inductively coupled plasma reactors, the gas flow rate may be adjusted as needed.

The dry-clean process can be carried out under typical plasma glow discharge process conditions to achieve an adequate concentration of active species to volatilize the organic and inorganic parasitic deposits upon the plasma chamber walls. Necessarily, the fluorine-containing gas is in an equal or greater volume than the chlorine-containing gas and, consequently, the fluorine-containing gas is introduced into the chamber at a greater rate than the chlorine-containing gas. This gas flow differential is particularly important because a preponderance of chlorine-containing gas will not effectively dry-clean and a mixture exceeding 90% by volume of fluorine-containing gas can result in the formation of the undesirable contaminant, powdery aluminum fluoride species $Al_xF_z$. In dry-clean etch processes employing capacitively coupled etch devices, the gas flow rate in sccm of the fluorine-containing gases ranges generally from 30 to 50 sccm while the flow rate for chlorine-containing gases ranges from 140 to 20 sccm. In those processes employing inductively coupled plasma devices, the gas flow rate of the fluorine-containing gases ranges from about 90 to 150 sccm and the flow rates of the chlorine-containing gases generally ranges from 80 to 20 sccm.

The process variables of: (a) gas mixture composition and flow rate; (b) the chamber pressure; (c) chamber wall temperature; (d) the workpiece pedestal temperature; and (e) the applied RF power level, can be selected to achieve optimal plasma dry cleaning. As indicated above, carbon-containing gases are operable in the present plasma contaminant removal process; but it is to be understood that such organic gases will polymerize to some extent under plasma glow conditions. Such polymer formation and subsequent deposition on the chamber interior can be counterproductive in the etch dry-clean use of the instant inorganic gas recipes. It is for this reason that inorganic fluorine-containing gases are preferred in the practice of the present invention. It is to be understood, however, that organic fluorine-containing etchant gases may be effective and operable in the practice of the present invention.

Fluorine-containing gases within the purview of the present invention include $SF_6$, $NF_3$, $ClF_3$, $CF_4$, $CHF_3$, $C_4F_8$, and mixtures thereof. Preferred fluorine-containing gases are the inorganic group of gases including $SF_6$, and $NF_3$. The inorganic chlorine-containing gases as the second component of the mixture include $Cl_2$, HCl, $BCl_3$, $CCl_4$, $SiCl_4$, and mixtures thereof.

Typical plasma assisted aluminum etch utilizes process gases mixtures of $BCl_3$, $Cl_2$, and optionally $N_2$. During a chlorine-based aluminum etch process, aluminum on the substrate reacts with chlorine atoms and, possibly, with chlorine-containing molecules to form volatile aluminum chloride molecular species. Some of this etch by-product is pumped out of the chamber, while some reacts with or associates with organic species from patterning photoresists of other reactive species in the process chamber to form non-volatile materials, many of which are loosely deposited as potential contaminants on the process chamber wall surfaces. The present invention is directed to the control of such contaminants.

The plasma etch dry-clean process of the invention using the instant halogenated gaseous mixture may be used in combination with a conventional capacitive discharge (parallel plate) plasma generator or with an inductively coupled plasma generator. The plasma associated with the etch chamber during the etch process of the invention may comprise a plasma generated within the etch chamber, or generated external to the etch chamber itself, wherein the reactant species flow to the chamber downstream from the plasma source.

FIG. 1 demonstrates a conventional parallel plate etching apparatus 100 which includes a closed metal plasma etch chamber 110 comprising a top lid 112, sidewalls 122 generally comprised of aluminum, and a chamber housing 114 having a connection 115 to an exhaust vacuum pump (not shown) for partial evacuation of the inner space of the chamber. Etchant and dry-clean gases of the present invention enter chamber 110 through a gas distribution plate 116 which is supplied with gases via a valved inlet system. The apparatus further includes an RF power supply source 117 which works in combination with a cathode which serves as a workpiece support pedestal 120 and with chamber walls 122, chamber housing 114, chamber lid 112, and gas distribution plate 116 which all serve as a grounded anode. A workpiece 121 is mounted on pedestal 120, which is shielded from (not shown) and separated from grounded anode chamber walls 122. The plasma etch system is configured in a manner to draw gases between gas distribution plate 116 and pedestal 120 in a manner which typically confines the reactant gas plasma in the general area 118 of workpiece 121. However, by removing processed wafer 121 and introducing the gas recipes of the instant invention, it is possible to dry etch clean the interior surfaces of any accumulated contaminants formed in the ongoing wafer workpiece 121 etching process.

In FIG. 1, a plasma is generated in area 118 of plasma chamber 110 by the application of RF power to pedestal 120. The outer boundaries of plasma area 118 depend on the operating parameters of etch chamber 100. The etch gases exit plasma chamber 110 through conduits 115 in response to an applied vacuum (not shown). The temperature of the substrate workpiece 121 can be controlled during processing by passing a heat-conducting inert gas between the interface gap 129 of support platform 120 and workpiece 121. To maintain the temperature of the support platform 120, cooling water is circulated through the cathode onto which support platform 120 is bolted. Water enters through conduit 130 and exits through conduit 131. A power supply 117 biases cathode pedestal 120 (i.e., support platform) with respect to the grounded anode comprising chamber walls 122, chamber housing 114, chamber lid 112, and gas distribution plate 116 to generate the electric field necessary to dissociate or ionize the gases contained in etch chamber 110.

Within the process design of FIG. 1, operational etch process and plasma film deposition parameters are as follows. The etch chamber process pressure should be below 700 mtorr and, preferably, range between about 10 to about 500 mtorr. The etch chamber sidewall (interior surfaces) temperatures are generally lower, at least 5° C. lower, in temperature than the workpiece temperature, to motivate movement of floating contaminant particles away from the workpiece. The workpiece temperature will be the operational temperature of the chamber and should range from about 50° C. to about 100° C. The RF power applied to the chamber should range from about 300 to about 800 W.

EXAMPLES

The following examples demonstrate the effectiveness of the instant inorganic halogen gas mixture as a contaminant cleaning gas recipe for the removal of residues from the interior surfaces of a plasma chamber in the practice of the present invention.

Example 1

This example provides a description of the general composition of contaminant deposits formed on the surfaces of a metal-etch processing chamber when the workpiece being etched is a silicon wafer overlaid with an aluminum layer which is further overlaid with a patterned photoresist comprising a phenol formaldehyde Novolak resin with a diazoquinone sensitizer. The etch plasma was formed from the following gases, each flowing at approximately 50 sccm: $BCl_3$, $Cl_2$ and $N_2$. The power applied ranged between about 500 and 800 W; process chamber pressure ranged between about 200 and 600 mtorr; the operational cathode temperature was about 80° C., while the chamber wall temperature was about 45° C. From 25–30 wafers were etched before evaluation. To evaluate contaminant buildup on plasma chamber 102 surfaces of FIG. 1, scrapings from chamber walls 122 were taken and analyzed. The data from this analysis demonstrated the presence (in atomic percent units for the elements detected) of about 10% to about 30% aluminum; about 2% to 4% silicon; about 1% to 4% boron; about 8% to 20% chlorine; about 7% to 40% carbon; about 3% to 40% nitrogen; and about 20% to about 40% oxygen, with minor or trace amounts of other elements. Some of the oxygen measured may have been the result of oxygen contacting the surface of the contaminant deposit buildup upon opening of the process chamber.

Binding energies and atom percentages for a typical contaminant deposit taken from the chamber walls 122 are provided below in Table 1.

TABLE 1

High resolution ESCA data: Binding energies, atom percentages and peak assignments. (Binding energies were corrected to the binding energy of the —$(CH_2)_n$— signal at 284.6 mV. Atom pereentages were calculated from the high resolution data. Peak assignments were based on the binding energies of reference compounds.

| Sample Description | $Al_1$ | $Si_1$ | $B_1$ | $Cl_1$ | $Cl_2$ | *$Cl_3$ | $C_1$ | $C_2$ | $C_3$ | $N_1$ | $N_2$ | $N_3$ | $O_1$ | $O_2$ | $F_1$ |
|---|---|---|---|---|---|---|---|---|---|---|---|---|---|---|---|
| PATTERNED WAFERS, ETCHED AT 60° C., CONTAMINANT DEPOSIT SCRAPED FROM CHAMBER WALL | | | | | | | | | | | | | | | |
| Binding energy (eV) | 75 | — | 192 | — | 198 | 201 | 285 | 286 | 288 | 399 | 400 | — | 531 | 533 | 639 |
| Atom percentage | 7 | — | 1 | — | 3 | 5 | 38 | 11 | 7 | 2 | 3 | — | 11 | 12 | 1 |

Peak Assignments:
$Al_1 = Al_2O_3, Al_xO_y$
$Si_1 = SiO_2$
$B_1 = B_xO_y$
$Cl_1 = Cl^-$
$Cl_2 = Cl^-$
$Cl_3$ = C—Cl
$C_1$ = C—R
$C_3$ = C—OR, C—Cl
$C_3$ = C—C—OR
$N_1 = NR_3$
$N_2 = NR_3$
$N_3 = NR_3$
$O_1$ = metal oxide, C=O, C—O
$O_2$ = C=O, C—O
$F_1$ = C—F Chemical analysis was also performed on contaminant samples scraped from the chamber walls 122 after $O_2/SF_6$ dry cleaning. Binding energies and atomic percentages are demonstrated in Table 2. The cleaning plasma was generated from 25 sccm $SF_6$ and 250 sccm $O_2$, 800 W, at 200 mtorr, with the chamber wall surface at about 65° C. The cleaning process was found very helpful in removal of hydrocarbon contaminants but ineffective in controlling generation of aluminum fluoride ($AlF_x$) species. An analysis of the data in Table 2 indicates that when a fluorine-containing plasma cleaning gas is used in combination with oxygen, nonvolatile aluminum fluoride ($AlF_x$) and aluminum oxyfluoride ($Al_xO_yF_z$) compounds are formed. Such compounds can build up on process chamber surfaces as parasitic contaminants and can clog the pores of the gas distribution plate. The data also suggests that aluminum fluoride ($Al_xF_y$) species are generated when a fluorine-containing cleaning gas is used as the sole halogen cleaning gas.

TABLE 2

High resolution ESCA data: Binding energies, atom percentages and peak assignments. signments. (Binding energies were corrected to the binding energy of the —(CH$_2$)$_n$— signal at 284.6 mV. Atom percentages were calculated from the high resolution data. Peak assignments were based on the binding energies of reference compounds.

| Sample Description | $Al_1$ | $S_1$ | $C_1$ | $C_2$ | $C_3$ | $N_1$ | $N_2$ | $O_1$ | $O_2$ | $F_1$ | $F_2$ |
|---|---|---|---|---|---|---|---|---|---|---|---|
| PATTERNED WAFERS ETCHED AT 60° C., FOLLOWED BY $O_2/SF_6$ PLASMA Dry-cleanING OF CHAMBER | | | | | | | | | | | |
| Binding energy (eV) | 76 | 170 | 285 | 286 | 289 | 400 | 402 | 533 | 534 | 485 | 687 |
| Atom percent | 19 | 0.8 | 14 | 4 | 3 | 1 | 1 | 5 | 3 | 11 | 35 |

Peak Assignments:
$Al_1$ = $ALF_x$
$S_1$ = $SO_x$
$C_1$ = C—R (R = C, B)
$C_2$ = C—$OR_1$, C—R
$C_3$ = O═C—OR
$N_1$ = $NR_3$
$N_2$ = N—$R_4^+$
$O_1$ = C═O
$O_2$ = C—O
$F_1$ = ionic F
$F_2$ = ionic F The bonding structure of aluminum suggests that at least a portion of the aluminum-containing etch by-product may not undergo a complex organometallic reaction with organic species during etch. Since the dipole moments of an aluminum chloride molecule and many organic molecules are high (due to an uneven distribution of electrons), it is quite possible that aluminum chloride molecules are fastened to organic species by van der Waals forces or by dipole-dipole interaction. To remove the aluminum-containing contaminant from the surface of the process chamber, then, would require contacting of the aluminum chloride/organic species compound with a "reactive species" capable of disrupting the van der Waals forces or the dipole-dipole interaction. In accordance with the present invention, one such "reactive species" is the instant inorganic gas mixture of fluorine and chlorine-containing gases.

The amount of the inorganic chlorine containing "reactive species" gas in combination with the fluorine-containing gas of the present gas mixture used to remove the contaminant from the process chamber surface is very important in achieving the best cleaning result. For example, it is desirable to have enough reactive species chlorine-containing inorganic gas to disrupt the binding forces or to reactively attack and break a covalent bond on the aluminum-comprising compound which forms the contaminant, and to suppress the generation of aluminum fluoride or aluminum oxyfluoride species or other nonvolatile aluminum-containing compounds that may be formed. It is equally important that the effectiveness of the fluorine-containing cleaning gas not be diminished. It has been found that rapid contaminant removal is dependent on a volume concentration of fluorine-containing gas in the total gas mixture being at least 50% or greater. In this regard the chlorine-containing gas should be present in a minimum amount of 10% to about 50% by volume of the total fluorine/chlorine gaseous mixture of the present invention.

Example 2

During development of the presently improved plasma dry cleaning process for aluminum etch process chambers, three kinds of dry cleaning plasmas were evaluated: those using oxygen-based chemistry; ones with fluorine-based chemistry; and those using chlorine-based chemistry. For example, cleaning plasmas were created which included $O_2$ and $SF_6$, $O_2/CF_4$, $O_2/N_2$, $BCl_3/Cl_2$, and $SF_6/Cl_2$. Contaminant deposits were removed from some locations within the process chamber, but the results obtained with oxygen-fluorine-based chemistry were not as good as results obtained using the fluorine-based chemistry in a mixture combination with chlorine-based chemistry.

This example describes techniques used to select the proper mixture composition of the instant dry-clean plasma generating gases, the process chamber pressure, and the RF power to achieve improved dry cleaning of the etch plasma chamber. (A constant operational wall temperature of about 65° C. was maintained.) To season the chamber there is provided a workpiece comprised of a solid silicon wafer overlaid with an aluminum layer which is further overlaid with a patterned photoresist comprised of a Shipley 1400-33 photoresist. A glow discharge plasma environment is created utilizing $BCl_3$, $Cl_2$, and $N_2$ gases, each flowing at approximately 50 sccm. The power applied ranges between 500 to 800 W, the process chamber pressure ranges from about 200 to 600 mtorr, the operational workpiece temperature is about 80° C., and the chamber wall temperature is maintained at 65° C. The power is applied for three minutes; and, thereafter, there is observed a solid film coating of approximately 0.2 (2,000 angstroms) micrometers throughout the chamber.

Experiments were carried out using a dry etch cleaning of the coated chamber employing the recipes listed above. The most effective recipe is the $SF_6/Cl_2$ mixture of which it was found that $SF_6$ etches hydrocarbon, but at a slower rate than $O_2$, but overall is very effective in reducing the amount of polymer in the chamber with very little or no aluminum oxyfluoride (white powder) formation. In addition, other dry-clean chemistries that were studied include $O_2/H_2O/CF_4$ or $SF_6$ itself and $O_2/CH_3OH/CF_4$ or $SF_6$ but they were not effective in controlling or eliminating aluminum oxyfluoride formation. In all recipes containing oxygen, the generation of aluminum oxyfluoride occurred. Such commonly used dry-clean recipes as $O_2/CF_4$, though effective in the removal of organic compounds, are not suitable for cleaning aluminum etch chambers due to the presence of aluminum in the polymer. Even though organic material can be removed by these dry-clean chemistries, $Al_xO_yF$ formation due to the presence of oxygen and fluorine cannot be avoided. As emphasized above, this white powder can, in itself, cause particle contamination problems and can clog the gas distribution plate holes. $SF_6/Cl_2$ was the most effective in the removal of hydrocarbons without adversely affecting the condition of the chamber.

Table 3, below, shows the compositional breakdown of the polymer coating remaining on the chamber after the dry-clean step. It should be noted that the amount of fluorine in the polymer after $SF_6/Cl_2$ dry-clean is the same as after $SF_6/O_2$ dry-clean, but the absence of $O_2$ prevents the formation of any aluminum oxyfluoride (white powder) reaction products. It has been further found that $SF_6/Cl_2$ dry-clean reduces particle spiking and has no effect on etch rate or etch rate uniformity. Also, dry-clean did not have any impact on profile or other process parameters.

TABLE 3

| | Chemical Composition of Polymer after Dry-clean (ESCA analysis, atomic percentage) | | | | |
|---|---|---|---|---|---|
| | NO DRY-CLEAN | $O_2/CF_4$ DRY-CLEAN | $O_2/SF_6$ DRY-CLEAN | $O_2/CF_4/CH_3OH$ DRY-CLEAN | $SF_6/Cl_2$ DRY-CLEAN |
| CARBON | 56 | 36 | 23 | 36 | 33 |
| NITROGEN | 5 | 9 | 8 | 9 | 7 |
| OXYGEN | 23 | 26 | 27 | 28 | 25 |
| ALUMINUM | 7 | 5 | 10 | 6 | 12 |
| FLUORINE | 1 | 0.2 | 16 | 1.3 | 18 |
| CHLORINE | 8 | 16 | 11 | 15 | 7 |

Other experiments were performed on etch chambers having the design configuration of FIG. 1 using a $SF_6/Cl_2$ cleaning gas mixture according to the present invention. As in the above examples, the chamber was coated with deposition from photoresist-coated wafers using gases from an aluminum etch process recipe. A dry cleaning frequency between etched wafers was between about 25 to 50 wafers. Flow rates of 85 sccm $SF_6$ and 10 sccm $Cl_2$ were used in the clean recipe. The chamber was operated at 100 mtorr, 200 watt, 0 gauss, and the dry-clean run for 60 seconds to six minutes. These experiments were performed using a 400 wafer run.

These experiments demonstrated that this $SF_6/Cl_2$ cleaning gas recipe applied in a plasma environment substantially free of oxygen did not affect any etch quality. Moreover, it was found that use of this gas mixture in dry-clean increased the mean wafer between clean (MWBC) rate (which is the average number of wafers processed between wet cleaning) by factors of 10 to 20%.

Figure 2:
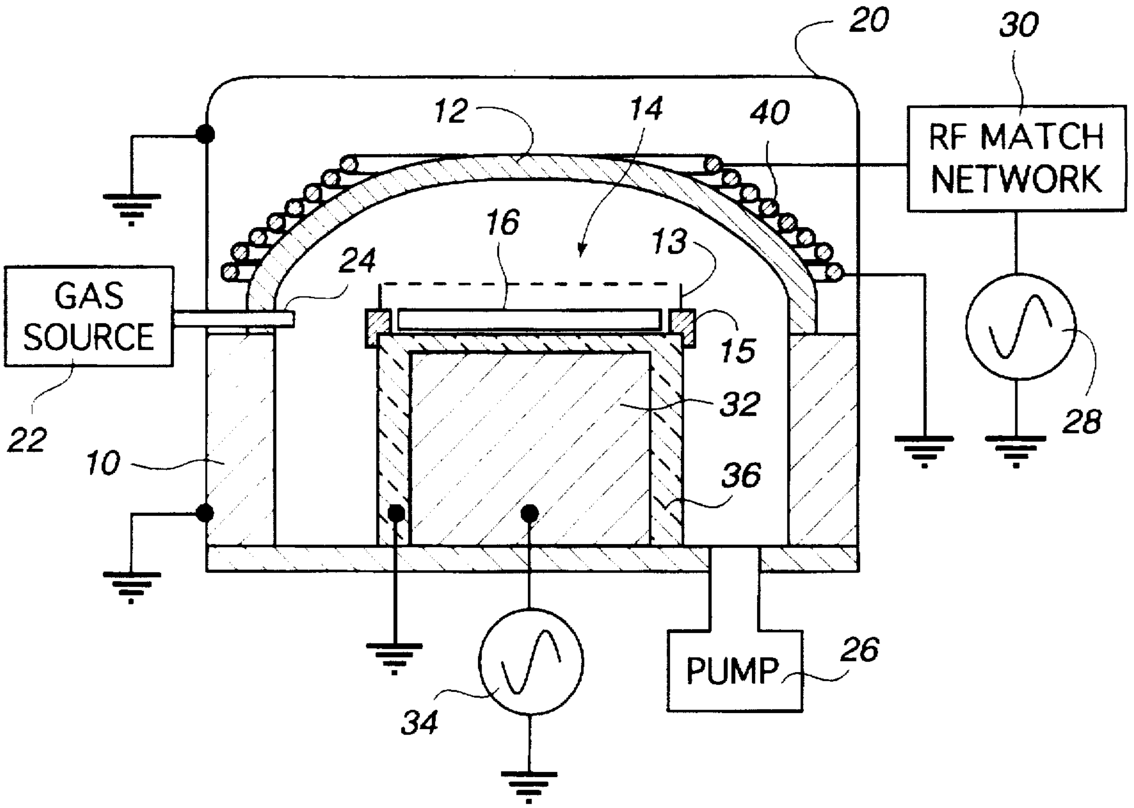
FIG. 2 is a schematic view of an inductively coupled etching apparatus having a plasma source decoupled from a bias power source to the wafer pedestal and illustrates a practice of the instant invention.

The etch chamber of FIG. 1 is one in which the plasma source is capacitively coupled to the cathode pedestal and the anode walls of the chamber; i.e., the pedestal and the chamber have one source of electrical power. FIG. 2 demonstrates an inductively coupled plasma etch chamber. Inductively coupled plasma reactors are currently used to perform various processes on semiconductor wafers, including metal and dielectric etching. In an etch process, one advantage of an inductively coupled plasma is that a high density plasma is provided to permit a large etch rate with a minimal plasma D.C. bias to reduce damage to the integrated circuit devices being fabricated on the workpiece (wafer). For this purpose, the source power applied to the antenna and the D.C. bias power applied to the wafer pedestal are separately controlled RF supplies. Separating the bias and source power supplies facilitates independent control of plasma density and ion energy, in accordance with well-known techniques. To produce an inductively coupled plasma, the antenna is a coil inductor adjacent the chamber, the coil inductor being connected to the RF source power supply. The coil inductor provides the RF power which sustains the plasma. The geometry of the coil inductor can in large part determine spatial distribution of the plasma ion density within the reactor chamber.

Referring to FIG. 2, an inductively coupled RF plasma reactor includes a reactor chamber having a grounded conductive cylindrical sidewall 10 and a dielectric ceiling 12, the reactor including a wafer pedestal 14 for supporting a semiconductor wafer 16 in the center of the chamber; a helical inductor coil 40 surrounding an upper portion of the chamber beginning near the plane of the top of the wafer or wafer pedestal 14 and extending upwardly therefrom toward the top of the chamber; a processing gas source 22 and gas inlet 24 for furnishing a processing gas into the chamber interior; and a vacuum pump 26 and a throttle for controlling the chamber pressure. The coil inductor 40 is energized by a plasma source power supply of RF generator 28 through a conventional active RF match network, the top winding of the coil inductor 40 being "hot" and the bottom winding being grounded. The wafer pedestal 14 includes an interior conductive portion 32 connected to a bias RF power supply or generator 34 and an exterior grounded conductor 36 (insulated from the interior conductive portion 32). A conductive grounded RF shield 20 surrounds the coil inductor 18.

The newer generation inductively coupled plasma reactors provide higher etch rates than older apparatuses preceding them. Accordingly, the contaminant deposition rate is increased and the onset of particle generation can occur sooner. Therefore there is a greater need for interim cleaning techniques to forestall major wet cleaning shutdowns which, in the case of these faster and more efficient chambers or etch tools, is an even more costly process downtime. The greatest source of contaminant particle accumulation in these apparatuses (as illustrated in FIG. 2) is on the interior of the dome (ceiling) and the process kit which comprises the clamp ring 15 (not used if an electrostatic chuck is installed), the focus ring 13 and the pedestal cover (not shown). Dry-clean etch application of the instant inorganic halogenated gas mixture has been found to clean the process kit and significantly increases the MWBC of these reactors. Typically, failure from excessive particulate contamination and the need to open the chamber for wet cleaning is caused by the flaking of deposition from the interior surface of the dome or walls of the chamber, and the flaking from the clamping ring 15 or focus ring hardware 13.

Experiments were carried out on an inductively coupled plasma reactor using pure chlorine and various $SF_6/Cl_2$ cleaning-gas recipes in an inductively coupled plasma chamber. The $SF_6/Cl_2$ recipes tested corresponded to sccm ratios of 30/140, 60/110, 90/80, and 150/20 at a fixed total flow of 170 sccm. The pure chlorine dry-clean was found to remove some of the deposition on the dome of the chamber, but the addition of increasing amounts of $SF_6$ dramatically improved removal of the deposition and the 150/20 $SF_6/Cl_2$ gas recipe completely cleaned the deposition on the dome. It was found that the remaining deposition thickness on the dome and also on the dome edge and the chamber wall decreases with the increasing percentage of $SF_6$. Qualitatively, the internal surface of the dome is dramatically cleaner with increasing quantities of the $SF_6$ in the $SF_6/Cl_2$ cleaning gas recipe.

The above experimental data indicates that employing the mixtures of halogen-containing gases of the present invention will result in dry-clean techniques which will more effectively prevent residue buildup in plasma processing chambers, enabling them to work more efficiently in that they will require cleaning less often.

Having described the invention, it will be apparent to those skilled in the art that various modifications can be made within the scope of the present invention. For example, the chamber configurations of FIGS. 1 and 2 are exemplary. Other plasma devices can similarly benefit from effective cleaning by employing the dry-clean recipes of the present invention.

We claim:

1. A method for cleaning the interior surfaces of a plasma treatment chamber comprising:

a) introducing an inorganic halogen containing plasma reactant gas mixture comprising an echant gaseous mixture of at least one fluorine-containing gas and an equal or lesser amount by volume of at least one chlorine-containing gas into a plasma treatment chamber;

b) generating a plasma by exiting the reactant gas mixture in an environment substantially free of any oxygen containing species; and c) contacting the interior surfaces of the chamber with the volatile reactive species of the plasma whereby at least a portion of the organic and metallic plasma processing residue byproducts are volatilized into gaseous species which are removed from the gas flow exit port of the chamber.

2. The method of claim 1 wherein the fluorine-containing gas is selected from the group consisting of $SF_6$, $NF_3$, $ClF_3$, $CF_4$, $CHF_3$, $C_4F_8$ and mixtures thereof and the chlorine-containing gas is selected from the group consisting of $Cl_2$, HCl, $BCl_3$, $CCl_4$, $SiCl_4$, and mixtures thereof.

3. The method of claim 2 wherein the fluorine-containing gases are selected from the group of inorganic gases consisting essentially of $SF_6$, $NF_3$, $ClF_3$ and mixtures thereof.

4. The method of claim 2 wherein the amount of fluorine-containing gas is in an amount of from about 50 to 90 volume percent of the total gas mixture.

5. The method of claim 4 wherein the amount of fluorine-containing gas is in an amount of from about 52% to 88% volume percent of the total gas mixture.

6. The method of claim 2 wherein the inorganic halogen-containing gas mixture is $SF_6/Cl_2$.

7. A method of plasma processing to remove residue following the plasma processing of a workpiece comprising:

a) providing a plasma processing apparatus comprised of a chamber and a pair of electrodes disposed opposite to one another;

b) supplying electrical energy between the electrodes in the chamber sufficient to generate plasma glow discharge conditions, one of which electrodes supports a semiconductor workpiece;

c) communicating into the chamber a reactive gas capable of forming a plasma under the electrical energy applied to the electrodes;

d) plasma processing the workpiece wherein etch byproducts are generated and attach to the interior walls of the chamber as contaminant residue deposits;

e) removing the workpiece from the chamber; and f) conducting a dry cleaning step comprised of: (I) introducing a plasma reactive etchant gas mixture of at least one fluorine-containing gas and an equal or lesser amount by volume of a chlorine-containing gas into the internal space of the chamber; (II) generating a plasma of the reactant gas mixture in an environment substantially free of any atomic oxygen species; and (III) impinging said plasma on the accumulated contaminant deposits attached to the interior surfaces of the chamber whereby the plasma volatilizes the residues into gaseous species which are removed from the chamber.

8. The method of claim 7 wherein the fluorine-containing gas is selected from the group consisting of $SF_6$, $NF_3$, $ClF_3$, $CF_4$, $CHF_3$, $C_4F_8$ and mixtures thereof, and the chlorine-containing gas is selected from the group consisting of $Cl_2$, HCl, $BCl_3$, $CCl_4$, $SiCl_4$, and mixtures thereof.

9. The method of claim 8 wherein the fluorine-containing gases are selected from the group of inorganic gases consisting essentially of $SF_6$, $NF_3$, $ClF_3$ and mixtures thereof.

10. The method of claim 7 wherein the amount of fluorine-containing gas is in an amount of from about 50 to 90 volume percent of the total gas mixture.

11. The method of claim 10 wherein the amount of fluorine-containing gas is in an amount of from about 52% to 88% volume percent of the total gas mixture.

12. The method of claim 9 wherein the inorganic halogen containing gas mixture is $SF_6/Cl_2$.

13. A method of residue controlled plasma processing of a workpiece in a plasma reactor comprising conducting a dry clean etch of the interior surfaces of the reactor chamber said etch being intermittent to an ongoing plasma processing of semiconductor workpieces and comprised of the steps: (a) introducing a halogen containing reactant gas mixture comprised of at least one fluorine containing gas and at least one of an even or lesser amount by volume of a chlorine-containing gas into the vacuum plasma processing chamber; (b) generating a plasma of said reactant gas in an environment substantially free of oxygen species; and (c) impinging the accumulated residues attached to the interior surfaces of the chamber with reactive species of the plasma whereby the residues are volatilized into gaseous species which are removed from the chamber.

* * * * *